United States Patent [19]
Nakayama

[11] Patent Number: 5,235,546
[45] Date of Patent: Aug. 10, 1993

[54] SEMICONDUCTOR MEMORY DEVICE HAVING TRANSFER GATE ARRAY ASSOCIATED WITH MONITORING CIRCUIT FOR BIT LINE PAIR

[75] Inventor: Hiroshi Nakayama, Tokyo, Japan

[73] Assignee: NEC Corporation, Tokyo, Japan

[21] Appl. No.: 706,711

[22] Filed: May 28, 1991

[30] Foreign Application Priority Data

May 28, 1990 [JP] Japan .................. 2-137374

[51] Int. Cl.⁵ .............................. G11C 7/00
[52] U.S. Cl. ............................ 365/190; 365/202
[58] Field of Search ......... 365/190, 202, 201, 189.07

[56] References Cited

U.S. PATENT DOCUMENTS 4,099,265  7/1978  Abe ........................... 365/190
5,146,427  9/1992  Sasaki et al. .................. 365/190

FOREIGN PATENT DOCUMENTS 014590 11/1981 Japan ........................ 365/202

Primary Examiner—William L. Sikes
Assistant Examiner—Toan Tran
Attorney, Agent, or Firm—Sughrue, Mion, Zinn, Macpeak & Seas

[57] ABSTRACT

A semiconductor memory device comprises memory cells, bit line pairs, word lines for allowing data bits to be read out from a row of the memory cells to the bit line pairs, sense amplifier circuits for increasing the magnitudes of small differential voltage levels on the bit line pairs, and a transfer gate array responsive to a column selecting signal for interconnecting one of the bit line pairs and a data line pair, wherein a monitoring circuit monitors one of the bit line pairs to be whether or not the sense amplifier circuit sufficiently increases the magnitude for allowing the column selecting signal to reach the transfer gate array so that any error due to insufficient magnitude does not take place in a read-out operation.

4 Claims, 3 Drawing Sheets

5,235,546

SEMICONDUCTOR MEMORY DEVICE HAVING TRANSFER GATE ARRAY ASSOCIATED WITH MONITORING CIRCUIT FOR BIT LINE PAIR

FIELD OF THE INVENTION

This invention relates to a semiconductor memory device and, more particularly, to a transfer gate array coupled between bit line pairs and a data line pair.

DESCRIPTION OF THE RELATED ART

A typical example of the semiconductor memory device is illustrated in FIG. 1, and comprises memory cells M11, M1n Mm1 and Mmn arranged in rows and columns. Word lines W1 to Wm are respectively coupled to the rows of the memory cells M11 to Mmn, and a plurality of bit line pairs BLP1 to BLPn are associated with the columns of the memory cells M11 to Mmn, respectively. Each of the memory cells M11 to Mmn stores a data bit, and the associated bit line pair BLP1 or BLPn propagates the bit line in the form of differential voltage to a transfer gate array 1. The transfer gate array 1 is implemented by a plurality of n-channel type field effect transistors An1, Qn2, Qnn−1 and Qnn coupled to the bit lines of the bit line pairs BLP1 to BLPn. Every two n-channel type field effect transistors Qn1 to Qnn are paired with one another, and every other n-channel type field effect transistor Qn1 or Qnn−1 is coupled to one of the data line pair DLP. The other n-channel type field effect transistors Qn2 and Qnn are coupled to the other of the data line pair DLP.

Sense amplifier circuits SA1 to SAn are respectively coupled to the bit line pairs BLP1 to BLPn, and each of the sense amplifier circuits SA1 to SAn comprises two series combinations of p-channel type field effect transistors Qp1 and Qp2 and n-channel type field effect transistors Qn3 and Qn4 coupled in parallel between two power signal lines 2a and 2b. The common drain node N1 or N2 of one of the series combinations is coupled to the gate electrodes of the other series combination, and the common drain nodes N1 and N2 are further coupled to the associated bit line pair BLP1 or BLPn.

Though not shown in the drawings, the power signal lines 2a and 2b are driven by a driving circuit responsive to an internal control signal produced by an internal timing generating unit, and one of the column selecting signals YSW1 to YSWn is produced with another internal timing signal also produced by the internal timing generating unit. The time interval between the two internal timing signals are usually fixed to a predetermined value.

The prior art semiconductor memory device thus arranged behaves as follows. If a data bit stored in the memory cell M11 is accessed, the word line W1 goes up to an active level, and the data bits are read out from the memory cells M11 to M1n to the bit line pairs BLP1 to BLPn, respectively. Small differential voltages are respectively produced on the bit line pairs BLP1 to BLPn, and are supplied to the common drain nodes of the respective sense amplifier circuits SA1 to SAn. The power signal line 2a is driven to a power voltage level, and the other power signal line 2b goes down to the ground voltage level. Then, the sense amplifier circuits SA1 to SAn are activated so that the small differential voltages are increased in magnitude. A column selecting signal YSW1 allows the n-channel type field effect transistors Qn1 and Qn2 to turn on, and the differential voltage is transferred from the bit line pair BLP1 to the data line pair DLP. The differential voltage thus transferred to the data line pair DLP is indicative of the data bit stored in the memory cell M11, and an output data signal is produced on the basis of the differential voltage level.

However, the prior art semiconductor memory device encounters a problem in that the transfer gate array 1 transfers a differential voltage on a bit line pair before the small differential voltage on the bit line pair is sufficiently developed by the associated sense amplifier circuit. Such an insufficiently developed differential voltage on the data line pair is causative of an error in a read-out operation.

SUMMARY OF THE INVENTION

It is therefore an important object of the present invention to provide a semiconductor memory device which is free from the error in the read-out operation due to insufficiently developed differential voltage.

To accomplish the object, the present invention proposes to monitor a differential voltage on a selected bit line pair to see whether or not the differential voltage is sufficiently developed for activating a transfer gate array.

In accordance with the present invention, there is provided a semiconductor memory device comprising a) a plurality of memory cells arranged in rows and columns and storing data bits, respectively, b) a plurality of bit line pairs respectively coupled to the columns of the memory cells, c) a plurality of word lines respectively coupled to the rows of the memory cells and selectively driven to an active level for allowing the data bits to be read out from the memory cells of the associated row to the plurality of bit line pairs, small differential voltage levels being produced on the bit line pairs, respectively, when the data bits are read out, d) a plurality of sense amplifier circuits respectively coupled to the bit line pairs and operative to increase the magnitudes of the small differential voltage levels so that large differential voltage levels take place on the bit line pairs, respectively, e) a data line pair propagating one of the large differential voltage level, f) a transfer gate array coupled between the plurality of bit line pairs and the data line pair and operative to interconnect one of the plurality of bit line pairs and the data line pair when a column selecting signal is supplied thereto, and g) a monitoring circuit operative to monitor the aforesaid one of the plurality of bit line pairs to see whether or not the small differential voltage level is developed into the large differential voltage level, the monitoring circuit allowing the transfer gate array to be responsive to the column selecting signal when the large differential voltage level takes place on the aforesaid one of the plurality of bit line pairs.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
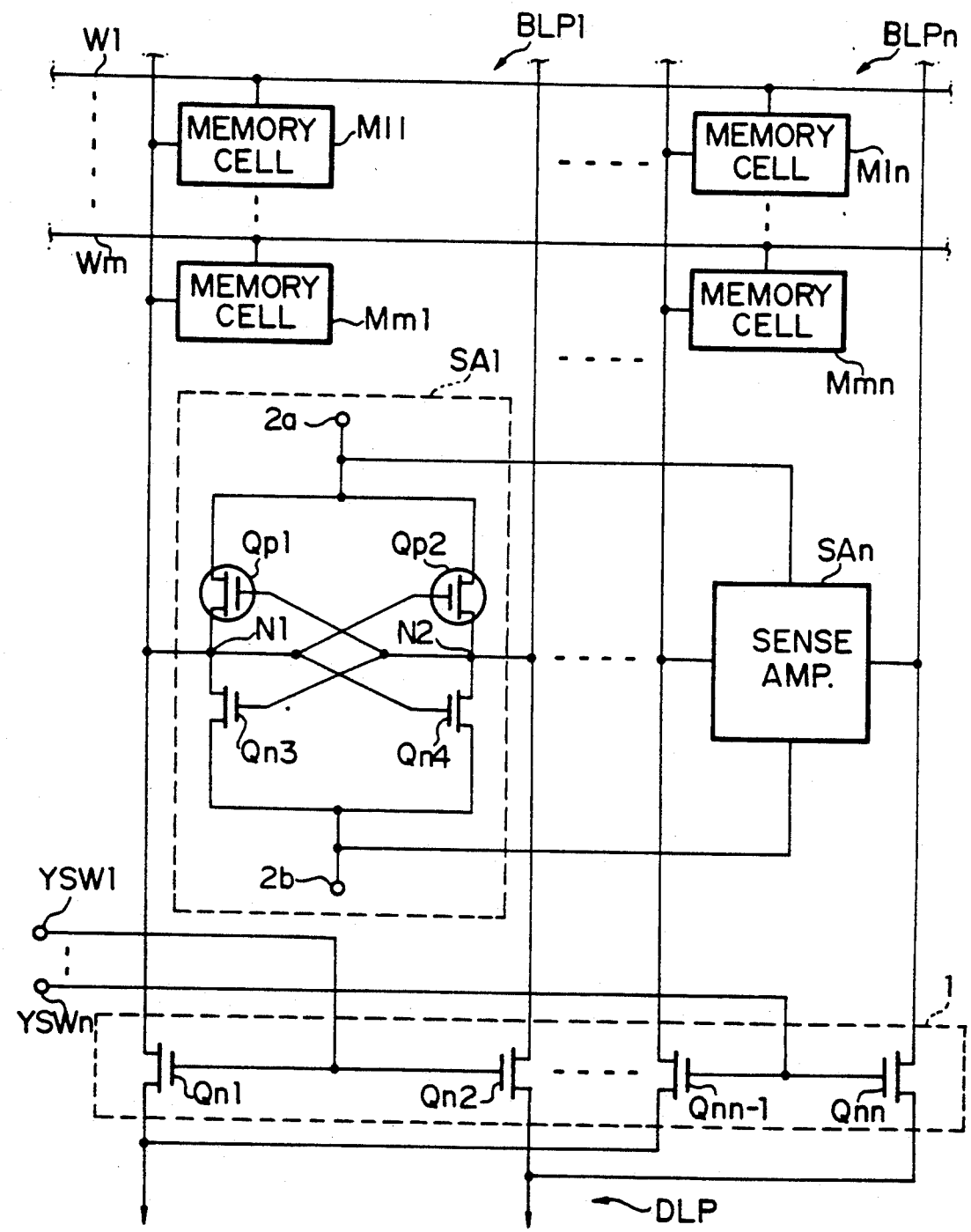
FIG. 1 is a circuit diagram showing the arrangement of the prior art semiconductor memory device.
Figure 2:
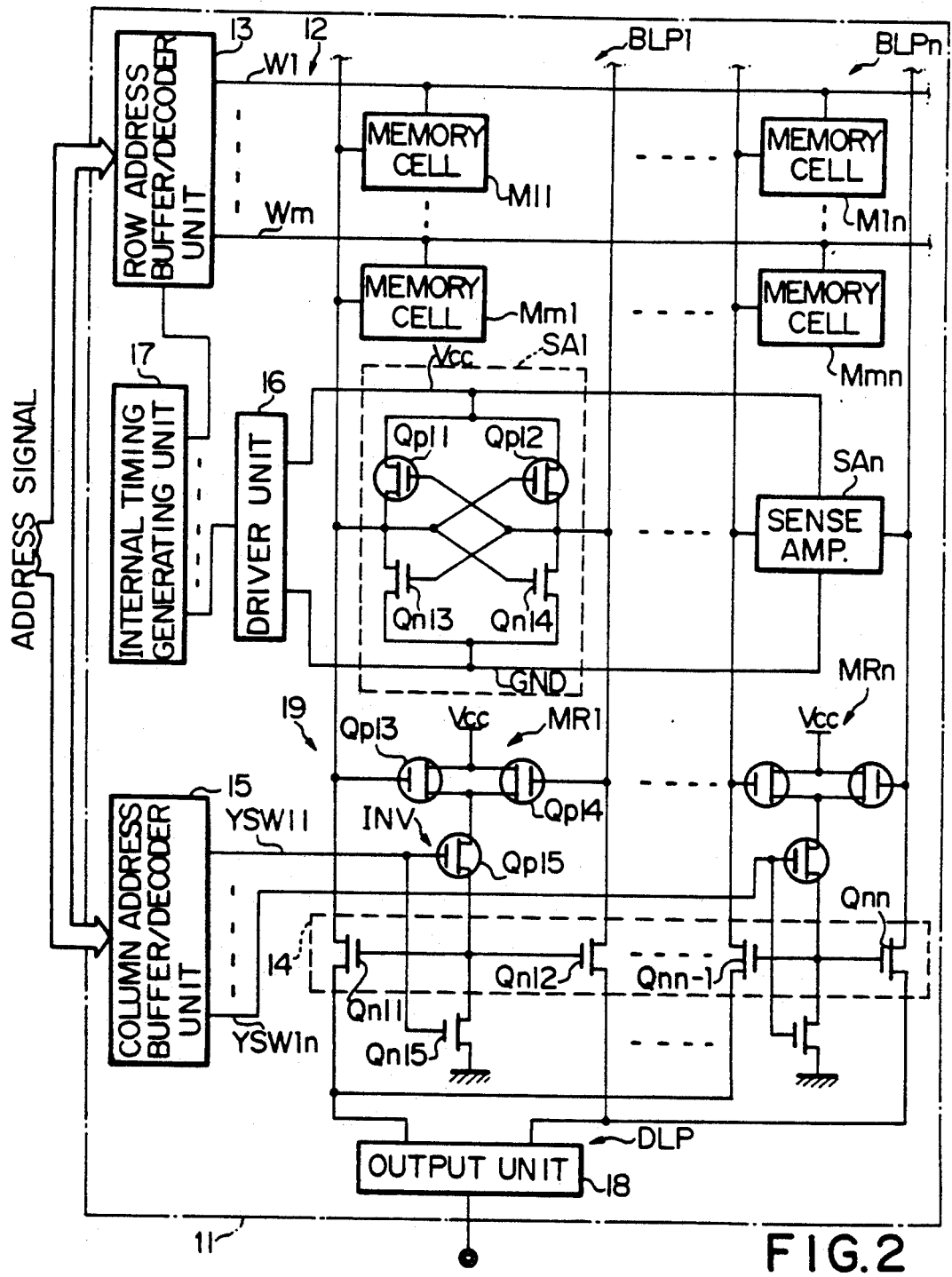
FIG. 2 is a circuit diagram showing the circuit arrangement of a semiconductor memory device according to FIG. 3 is a circuit diagram showing the arrangement of another semiconductor memory device according to the present invention.

Referring to FIG. 2 of the drawings, a semiconductor memory device embodying the present invention is fabricated on a single semiconductor chip 11 and comprises a memory cell array 12 implemented by a plurality of memory cells M11, M1n, Mm1 and Mmn arranged in rows and columns. A plurality of word lines W1 to Wm are respectively coupled to the rows of the memory cells M11 to Mmn, and a row address buffer/decoder unit 13 selectively drives the word lines W1 to Wm on the basis of row address bits of an address signal.

The columns of the memory cells M11 to Mmn are respectively coupled to a plurality of bit line pairs BLP1 to BLPn, and the bit line pairs BLP1 to BLPn respectively propagate data bits read out from the memory cells driven by one of the word lines W1 to Wm to a transfer gate array 14. The transfer gate array 14 is implemented by n-channel type field effect transistors Qn11, Qn12, Qnn−1 and Qnn coupled to the bit line pairs BLP1 to BLPn, and is responsive to column selecting signals YSW11 to YSW1n. The column selecting signals YSW11 to YSW1n are selectively shifted to an active low level, and the column address buffer/decoder unit 15 shifts one of the column selecting signals YSW11 to YSW1n on the basis of column address bits of the address signal.

The bit line pairs BLP1 to BLPn are further coupled to a plurality of sense amplifier circuits SA1 to SAn, respectively, and each of the sense amplifier circuits SA1 to SAn comprises two series combinations of p-channel type field effect transistors Qp11 and Qp12 and n-channel type field effect transistors Qn13 and Qn14 coupled in parallel between a power voltage line Vcc and a ground voltage line GND. The power voltage line Vcc and the ground voltage line GND are driven to the power voltage level Vcc and the ground voltage level by a driver unit 16, and an internal timing generating unit 17 sequentially provides timings at which the row address buffer/decoder unit 13, the driver unit 16 and the column address buffer/decoder unit 15 are activated. The output nodes of the transfer gate array 14 are coupled to a data line pair DLP which in turn is connected to an output unit 18. Although other peripheral circuits such as a precharging circuit are associated with the memory cell array 12, no description is incorporated hereinbelow because they do not directly concern the gist of the present invention.

The semiconductor memory device according to the present invention further comprises a monitoring circuit 19, and the monitoring circuit 19 has a plurality of monitoring units MR1 to MRn associated with the plurality of bit line pairs BLP1 to BLPn, respectively. Each of the monitoring units MR1 to MRn comprises two p-channel type watching transistors Qp13 and Qp14, and an inverter INV implemented by a series combination of a p-channel type field effect transistor Qp15 and an n-channel type field effect transistor Qn15. The gate electrodes of the watching transistors Qp13 and Qp14 are coupled to the component bit lines of the associated bit line pairs BLP1 or BLPn, and can provide current path between the power voltage line Vcc and the inverter INV. One of the column selecting signals YSW11 to YSW1n is supplied to the input node of the inverter INV, i.e., the gate electrodes of the component field effect transistors Qp15 and Qn15, and the output node of the inverter INV or the common drain node of the component transistors Qp15 and Qn15 is coupled to the gate electrodes of the n-channel type field effect transistors Qn11 and Qn12, or Qnn−1 and Qnn coupled to the associated bit line pair BLP1 or BLPn.

Description is hereinbelow made on the circuit behavior of the monitoring circuit 19 on the assumption that a data bit of the memory cell M11 is accessed. Prior to the access, the bit line pairs BLP1 to BLPn are well balanced at about Vcc/2 level, and Vcc/2 is applied to the gate electrodes of the p-channel type watching transistors Qp13 and Qp14. The total current driving capability Ions of the watching transistors Qp13 and Qp14 is given as $$Ions = 2 \times G(Vcc/2 - Vt)^2/2 \qquad \text{Equation 1}$$

where G is the amplification factor, and Vt is the threshold level of the watching transistor.

When the address signal designates the memory cell M11, the row address buffer/decoder unit 13 drives the word line W1 to the active high level, and the memory cell M11 is conducted to one of the component bit lines of the associated bit line pair BLP1. Then, the data bit is read out from the memory cell M11, and a small differential voltage takes place on the bit line pair BLP1. The other memory cells M1n coupled to the word line W1 also provide data bits to the associated bit line pairs BLPn.

The internal timing generating unit 17 causes the driver unit 16 to supply the power voltage level Vcc and the ground voltage level to the power voltage line Vcc and the ground voltage line GND, respectively, and the sense amplifier circuits SA1 to SAn are activated so that the small differential voltages on the bit line pairs BLP1 to BLPn are developed by the sense amplifier circuits SA1 to SAn, respectively.

Assuming now that the internal timing generating unit 15 allows the column address buffer/decoder unit 15 to shift the column selecting signal YSW11 to the active low level before the small differential voltage on the bit line pair BLP1 is sufficiently developed. The p-channel type field effect transistor Qp15 turns on, and the n-channel type field effect transistor Qn15 turns off in the presence of the column selecting signal YSW11 of the active low level. While the differential voltage on the bit line pair BLP1 is still on the way to the sufficiently developed level, the current driving capability of the p-channel type watching transistors Qp13 and Qp14 is still small, and the gate electrodes of the n-channel type field effect transistors Qn11 and Qn12 do not promptly exceed the threshold level of the n-channel type field effect transistors Qn11 and Qn12. When the differential voltage is sufficiently developed, one of the watching transistors Qp13 and Qp14 turns off, and the current driving capability Iona of the other watching transistor Qp13 or Qp14 is given by Equation 2.

$$Iona = G(Vcc - Vt)^2/2 \qquad \text{Equation 2}$$

The ratio of the current driving capability Iona to the total current driving capability Ions is given as $$Iona/Ions = 2(Vcc - Vt)^2/(Vcc - 2Vt)^2 \qquad \text{Equation 3}$$

Thus, the current driving capability of the watching transistors Qp13 and Qp14 is increased with the differential voltage on the bit line pair BLP1, and the gate electrodes of the n-channel type field effect transistors Qn11 and Qn12 exceed the threshold level, thereby allowing the n-channel type field effect transistors Qn11 and Qn12 to turn on.

The n-channel type field effect transistors Qn11 and Qn12 transfers the large differential voltage or the sufficiently developed differential voltage to the data line pair DLP, and the output unit 18 produces an output signal indicative of the data bit read out from the memory cell M11. The output signal is, then, supplied to an external device.

On the other hand, if the column selecting signal YSW11 goes down to the active low level after the differential voltage on the bit line pair BLP1 is sufficiently developed, the large current driving capability Iona allows the gate electrodes of the n-channel type field effect transistors Qn11 and Qn12 to promptly exceed the threshold level, and the large differential voltage level transfers to the data line pair DLP at once.

As will be understood from the foregoing description, the monitoring unit introduces time delay or promptly transfers the column selecting signal depending upon the differential voltage on the associated bit line pair, and only the large differential voltage level is surely transferred to the data line pair. This results in that the output unit 18 is prevented from any error in the read-out operation.

Second embodiment

Figure 3:
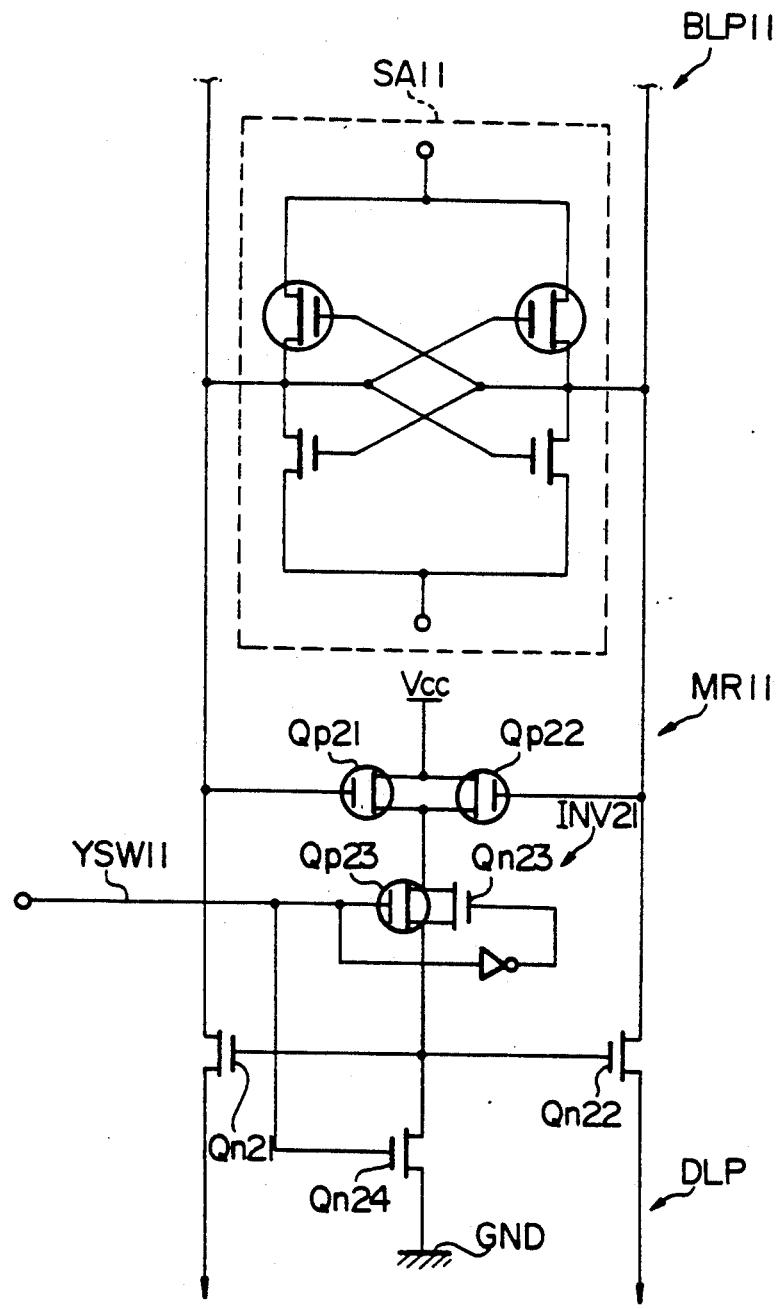

Turning to FIG. 3 of the drawings, another monitoring unit MR11 is associated with a bit line pair BLP11 coupled to a sense amplifier circuit SA11, and n-channel type transfer gate transistors Qn21 and Qn22 are coupled between the associated bit line BLP11 and a data line pair DLP. Although memory cell array, peripheral circuits, word lines, and other bit line pairs coupled to sense amplifier circuits as well as monitoring units are integrated on a single semiconductor chip together with the monitoring unit MR11, they are not illustrated in FIG. 3, nor described hereinbelow for the sake of simplicity.

The monitoring unit MR11 forms a part of a monitoring circuit, and comprises p-channel type watching transistors Qp21 and Qp22 and an inverter INV21. The inverter INV21 comprises a parallel combination of a p-channel type field effect transistor Qp23 and an n-channel type field effect transistor Qn23, an n-channel type field effect transistor Qn24 coupled between the parallel combination and a ground voltage line GND, and an inverter coupled between the gate electrodes of the parallel combination. Since the p-channel type field effect transistor Qp15 is replaced with the parallel combination, current is promptly fed to the gate electrodes of the n-channel type field effect transistors Qn21 and Qn22 because of large current driving capability of the parallel combination. However the circuit behavior of the second embodiment is similar to the first embodiment, and, for this reason, detailed description is omitted for avoiding repetition.

Although particular embodiments of the present invention have been shown and described, it will be obvious to those skilled in the art that various changes and modifications may be made without departing from the spirit and scope of the present invention. For example, the monitoring circuit according to the present invention is applicable to any kind of semiconductor memory device as long as a transfer gate array is coupled between a sense amplifier circuit and a data line pair.

What is claimed is:

1. A semiconductor memory device comprising
   a) a plurality of memory cells arranged in rows and columns and storing data bits, respectively,
   b) a plurality of bit line pairs respectively coupled to the columns of said memory cells,
   c) a plurality of word lines respectively coupled to the rows of said memory cells and selectively driven to an active level for allowing said data bits to be read out from said memory cells of the associated row to said plurality of bit line pairs, small differential voltage levels being produced on said bit line pairs, respectively, when said data bits are read out,
   d) a plurality of sense amplifier circuits respectively coupled to said bit line pairs and operative to increase the magnitudes of said small differential voltage levels so that large differential voltage levels take place on the bit line pairs, respectively,
   e) a data line pair propagating one of said large differential voltage level,
   f) a transfer gate array coupled between said plurality of bit line pairs and said data line pair and operative to interconnect one of said plurality of bit line pairs and said data line pair when a column selecting signal is supplied thereto, and
   g) a monitoring circuit operative to monitor said one of said plurality of bit line pairs to see whether or not said small differential voltage level is developed into said large differential voltage level, said monitoring circuit allowing said transfer gate array to be responsive to said column selecting signal when said large differential voltage level takes place on said one of said plurality of bit line pairs.

2. A semiconductor memory device as set forth in claim 1, in which said monitoring circuit comprises a plurality of monitoring units respectively associated with said bit line pairs and coupled in parallel between first and second sources of voltage level, respectively, and in which each of said monitoring units comprises a pair of watching transistors coupled to said first source of voltage level and having gate electrodes coupled to said associated bit line pair, and an inverter coupled between said watching transistors and said second source of voltage level and operative to gate transfer gates of said transfer gate array coupled between said associated bit line pair and said data line pair with said column selecting signal.

3. A semiconductor memory device as set forth in claim 2, in which said inverter is implemented by first and second field effect transistors opposite in channel conductivity to each other and coupled in series between said watching transistors and said second source of voltage level, said column selecting signal being supplied to the gate electrodes of said first and second field effect transistors, the common drain node of said first and second field effect transistors being coupled to the gate electrodes of said transfer gates.

4. A semiconductor memory device as set forth in claim 2, in which said inverter comprises a parallel combination of first and second field effect transistors opposite in channel conductivity type to each other and coupled to said watching transistors, a third field effect transistor identical in channel conductivity type with said second field effect transistor and coupled between said parallel combination and said second source of voltage level, and an inverting circuit coupled between the gate electrode of said first field effect transistor and the gate electrode of said second field effect transistor, said column selecting signal being supplied to the gate electrodes of said first and third field effect transistors.

* * * * *

UNITED STATES PATENT AND TRADEMARK OFFICE
CERTIFICATE OF CORRECTION

PATENT NO. : 5,235,546
DATED : August 10, 1993
INVENTOR(S) : Hiroshi NAKAYAMA It is certified that error appears in the above-identified patent and that said Letters Patent is hereby corrected as shown below:

Column 4, line 68, under Equation 3 insert --$\geq 2$--.

Signed and Sealed this

Sixteenth Day of August, 1994

Attest:

BRUCE LEHMAN

*Attesting Officer*    *Commissioner of Patents and Trademarks*